United States Patent
Morita

(10) Patent No.: US 11,952,513 B2
(45) Date of Patent: Apr. 9, 2024

(54) ADHESIVE COMPOSITION, FILM-LIKE ADHESIVE AND PRODUCTION METHOD THEREOF, AND SEMICONDUCTOR PACKAGE USING FILM-LIKE ADHESIVE AND PRODUCTION METHOD THEREOF

(71) Applicant: FURUKAWA ELECTRIC CO., LTD., Tokyo (JP)

(72) Inventor: Minoru Morita, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 281 days.

(21) Appl. No.: 17/338,147

(22) Filed: Jun. 3, 2021

(65) Prior Publication Data

US 2021/0292617 A1    Sep. 23, 2021

Related U.S. Application Data

(63) Continuation of application No. PCT/JP2020/017152, filed on Apr. 21, 2020.

(30) Foreign Application Priority Data

Aug. 22, 2019    (JP) ................................ 2019-152371

(51) Int. Cl.
  *C09J 163/00*   (2006.01)
  *C09J 7/35*     (2018.01)
  (Continued)

(52) U.S. Cl.
  CPC ............. *C09J 163/00* (2013.01); *C09J 7/35* (2018.01); *C09J 11/04* (2013.01); *C09J 11/08* (2013.01);
  (Continued)

(58) Field of Classification Search
  CPC ... C09J 163/00; C09J 7/35; C09J 11/04; C09J 11/08; H01L 21/6836; H01L 21/78;
  (Continued)

(56) References Cited

U.S. PATENT DOCUMENTS 11,139,261 B2 * 10/2021 Morita .................. C09J 163/00
2015/0021763 A1 * 1/2015 Na .......................... H01L 24/17
                                                                257/737
2019/0181113 A1    6/2019 Morita et al.

FOREIGN PATENT DOCUMENTS

CN        105899630 A    8/2016
CN        107406742 A    11/2017
(Continued)

OTHER PUBLICATIONS

International Search Report (PCT/ISA/210) issued in PCT/JP2020/017152, dated Jul. 14, 2020.
(Continued)

*Primary Examiner* — Jasmine J Clark
(74) *Attorney, Agent, or Firm* — Birch, Stewart, Kolasch & Birch, LLP

(57) ABSTRACT

An adhesive composition, containing an epoxy resin (A), an epoxy resin curing agent (B), a polymer component (C) and an inorganic filler (D), in which the inorganic filler (D) satisfies the condition (1) of (an average particle diameter (d50) is 0.1 to 3.5 μm) and condition (2) of (a ratio of a particle diameter at 90% cumulative distribution frequency (d90) to the average particle diameter (d50) is 5.0 or less), and a proportion of the inorganic filler (D) in a total content of the epoxy resin (A), the epoxy resin curing agent (B), the polymer component (C) and the inorganic filler (D) is 20 to 70% by volume;
  a film-like adhesive and a production method thereof; and
  a semiconductor package and a production method thereof.

7 Claims, 2 Drawing Sheets

(51) Int. Cl.
| | |
|---|---|
| *C09J 11/04* | (2006.01) |
| *C09J 11/08* | (2006.01) |
| *H01L 21/683* | (2006.01) |
| *H01L 21/78* | (2006.01) |
| *H01L 23/00* | (2006.01) |
| *H01L 25/065* | (2023.01) |

(52) U.S. Cl.
CPC .......... *H01L 21/6836* (2013.01); *H01L 21/78* (2013.01); *H01L 24/32* (2013.01); *H01L 24/48* (2013.01); *H01L 24/73* (2013.01); *H01L 24/83* (2013.01); *H01L 25/0657* (2013.01); *C09J 2301/314* (2020.08); *C09J 2301/408* (2020.08); *C09J 2463/00* (2013.01); *C09J 2471/00* (2013.01); *H01L 2221/68327* (2013.01); *H01L 2224/32225* (2013.01); *H01L 2224/48225* (2013.01); *H01L 2224/73265* (2013.01); *H01L 2224/83203* (2013.01); *H01L 2224/83862* (2013.01); *H01L 2225/0651* (2013.01); *H01L 2225/06562* (2013.01); *H01L 2225/06582* (2013.01)

(58) Field of Classification Search
CPC ......... H01L 24/32; H01L 24/48; H01L 24/73; H01L 24/83; H01L 25/0657
USPC .................................................. 257/738, 787
See application file for complete search history.

(56) References Cited

FOREIGN PATENT DOCUMENTS

| | | |
|---|---|---|
| CN | 109643662 A | 4/2019 |
| CN | 110023444 A | 7/2019 |
| JP | 2002-226824 A | 8/2002 |
| JP | 2009-179488 A | 8/2009 |
| JP | 2009-231494 A | 10/2009 |
| JP | 2010-218975 A | 9/2010 |
| JP | 2011-225856 A | 11/2011 |
| JP | 2012-144661 A | 8/2012 |
| JP | 2012-207222 A | 10/2012 |
| JP | 2012-214642 A | 11/2012 |
| JP | 2012-228771 A | 11/2012 |
| JP | 2017-95570 A | 6/2017 |
| JP | 6366228 B2 | 8/2018 |
| JP | 2018-168234 A | 11/2018 |
| JP | 2018-188540 A | 11/2018 |
| JP | 2019-91737 A | 6/2019 |
| TW | 201239056 A1 | 10/2012 |
| TW | 201815951 A | 5/2018 |
| WO | WO 2017/220137 A1 | 12/2017 |

OTHER PUBLICATIONS

Notice of Reasons for Refusal issued in Japanese Application No. 2020-543829, dated Nov. 10, 2020.
Written Opinion of the International Searching Authority (PCT/ISA/237) issued in PCT/JP2020/017152, dated Jul. 14, 2020.
Taiwanese Office Action for Taiwanese Application No. 109113616, dated Aug. 1, 2022, with English translation.
Chinese Office Action and Search Report for Chinese Application No. 202080006639.4, dated Aug. 11, 2022, with an English translation.
Korean Office Action for Korean Application No. 10-2021-7017194, dated Aug. 18, 2022, with an English translation.
Taiwanese Office Action and Search Report for corresponding Taiwanese Application No. 109113616, dated Dec. 17, 2021, with English translation.
Chinese Office Action and Search Report for Chinese Application No. 202080006639.4, dated Feb. 15, 2023, with an English translation.
Philippine Office Action for Philippine Application No. 1/2021/551244, dated Feb. 2, 2023.
Chinese Office Action for Chinese Application No. 202080006639.4, dated Aug. 29, 2023, with an English translation.
Chinese Office Action and Search Report for Chinese Application No. 202080006639.4, dated May 23, 2023, with an English translation.

* cited by examiner

ADHESIVE COMPOSITION, FILM-LIKE ADHESIVE AND PRODUCTION METHOD THEREOF, AND SEMICONDUCTOR PACKAGE USING FILM-LIKE ADHESIVE AND PRODUCTION METHOD THEREOF

CROSS-REFERENCE TO RELATED APPLICATIONS

This application is a Continuation of PCT International Application No. PCT/JP2020/017152 filed on Apr. 21, 2020, which claims priority under 35 U.S.C. § 119 (a) to Japanese Patent Application No. 2019-152371 filed in Japan on Aug. 22, 2019. Each of the above applications is hereby expressly incorporated by reference, in its entirely, into the present application.

TECHNICAL FIELD

The present invention relates to an adhesive composition, a film-like adhesive and a production method thereof, and a semiconductor package using the film-like adhesive and a production method thereof.

BACKGROUND ART

With advanced downsizing, high-functionality, and multi-functionality of electronic devices in recent years, high-functionality and multi-functionality have also been advanced in semiconductor packages mounted in the electronic devices, and miniaturization in the wiring rule of the semiconductor wafer has been advanced. Stacked MCPs (Multi Chip Package) in which semiconductor chips are multistacked have been widely spread along with high-functionality and multi-functionality. Such stacked MCPs are mounted on memory packages for mobile phones, portable audio devices, and the like. Further, along with multi-functionality of mobile phones and the like, high densification and high integration of the package have also been advanced. Along with such advance, multistacking of the semiconductor chips has been further advanced.

Film-like adhesives (die attach films) have been used for bonding a wiring board and a semiconductor chip or bonding semiconductor chips (that is, die attach) in the production process of such a memory package. This die attach film is required to have sufficient adhesiveness. Along with multistacking of the chips, reduction in thickness of the die attach film has also been demanded. Also, miniaturization in a wiring rule of the wafer has been advanced in recent years, and, as a result, heat is more likely to be generated on the surface of the semiconductor element. Therefore, in order to facilitates releasing of heat to outside of the package, these die attach films have been required to have high thermal conductivity.

As a thin thermally conductive die attach film, films formed by using a thermally conductive filler having a small particle diameter are generally designed. However, when the particle diameter is small, a specific surface area becomes large, and thus interaction between fillers becomes significant. As a result, aggregation of the fillers tends to occur due to mixing with resin. Moreover, when the particle diameter is small, the fluidity of the film-like adhesive generally tends to decrease, that is, the melt viscosity thereof tends to increase. As a result, the thin thermally conductive die attach film tends to cause voids to be involved into the back surface of the semiconductor chip or the wiring board which is an adherend. Moreover, the film cannot be sufficiently embedded in the unevenness of the wiring board and thus does not exhibit so-called anchor effect. Therefore, problems such as reduction in adhesive force and reduction in heat dissipation performance tend to occur.

As a material that can be used as the thermally conductive die attach film, for example, Patent Literature 1 describes an adhesive sheet containing a spherical alumina filler having an average particle diameter of 2 to 9 μm and a specific surface area of 0.8 to 8.0 m$^2$/g and a resin component containing a polymer component and a low molecular weight component at a specific weight content ratio, wherein the content of the spherical alumina filler in the adhesive sheet is a specific amount. Patent Literature 1 describes that this adhesive sheet increases a filling property into the unevenness of the adherend, thus enabling to suppress generation of voids.

Further, Patent Literature 2 describes an insulation sheet containing a filler having an average particle diameter of 0.1 to 5 μm, a polymer, an epoxy resin or an oxetane resin, and a curing agent, wherein the arithmetic average roughness Ra of the surface thereof is 0.1 to 3 μm and the content of the filler in the insulation sheet is a specific amount. Patent Literature 2 describes that this insulation sheet enhanced adhesion strength between a conductive layer and the insulation sheet after curing.

CITATION LIST

Patent Literatures

Patent Literature 1: Japanese Patent No. 6366228
Patent Literature 2: JP-A-2010-218975 ("JP-A" means an unexamined published Japanese patent application)

SUMMARY OF INVENTION

Technical Problem

Recently, further reduction in thickness of the thermally conductive die attach film has been demanded. However, when the thickness of the film is further reduced to less than 10 μm, voids are more likely to be generated between the film and the back surface of the semiconductor chip or the wiring board which is an adherend.

It is conceived that, in the sheets described in Patent Literatures 1 and 2, when a thin film having a smaller thickness, a thickness of less than 10 μm is produced, presence of aggregates of the filler or coarse particles caused by the small particle diameter of the filler becomes significant in the film. As a result, in the adhesive sheet described in Patent Literature 1, generation of voids cannot be sufficiently suppressed. Also in the insulation sheet described in Patent Literature 2, the arithmetic average roughness Ra of the surface of 0.1 to 3 μm, defined in Patent Literature 2 cannot be achieved, failing to obtain sufficient adhesive force.

Moreover, it has been found that a thin film having a thickness of less than 10 μm cannot exhibit sufficient anchor effect, even if generation of voids could be suppressed, and thus cannot provide sufficient adhesive force between the adherend in some cases.

The present invention is conceived in view of the problems of the above conventional arts, and provides an adhesive composition that can provide a film-like adhesive which suppress generation of voids after a die attach step at a high level, can exhibit high adhesive force between an adherend, and can exhibit excellent thermal conductivity.

In addition, the present invention provides a film-like adhesive having the above excellent characteristics and the production method thereof, and a semiconductor package using this film-like adhesive and the production method thereof.

Solution to Problem

As a result of conducting diligent research to solve the above problems, the present inventors found that the above objects can be achieved by the following configurations.

(1)
An adhesive composition, containing:
an epoxy resin (A);
an epoxy resin curing agent (B);
a polymer component (C); and
an inorganic filler (D),
wherein the inorganic filler (D) satisfies the condition (1) of (an average particle diameter (d50) is 0.1 to 3.5 μm) and condition (2) of (a ratio of a particle diameter at 90% cumulative distribution frequency (d90) to the average particle diameter (d50) is 5.0 or less), and
wherein a proportion of the inorganic filler (D) in a total content of the epoxy resin (A), the epoxy resin curing agent (B), the polymer component (C) and the inorganic filler (D) is 20 to 70% by volume.

(2)
The adhesive composition described in the above item (1),
wherein when a film-like adhesive obtained from the adhesive composition is heated at a temperature elevation rate of 5° C./min from 25° C., a melt viscosity at 70° C. reaches a range of 6,000 to 50,000 Pa·s, and a melt viscosity at 120° C. reaches a range of 500 to 10,000 Pa·s, and
wherein a cured product having a thermal conductivity of 1.0 W/m·K or more is obtained after thermal curing of the film-like adhesive.

(3)
The adhesive composition described in the above item (1) or (2), wherein the polymer component (C) contains a phenoxy resin.

(4)
The adhesive composition described in any one of the above items (1) to (3),
wherein the inorganic filler (D) is a particle made of a thermally conductive material or a particle whose surface is coated with the thermally conductive material, and
wherein a thermal conductivity of the thermally conductive material is 12 W/m·K or more.

(5)
A film-like adhesive, which is obtained from the adhesive composition described in any one of the above items (1) to (4),
wherein an arithmetic average roughness Ra of at least one of surfaces of the film-like adhesive is 3.0 μm or less, and
wherein a thickness of the film-like adhesive is in a range of 1 μm or more and less than 10 μm.

(6)
A method of producing a film-like adhesive, including producing by applying the adhesive composition described in any one of the above items (1) to (4) on a substrate film subjected to release treatment and drying the adhesive composition.

(7)
A method of producing a semiconductor package, including:
a first step of providing an adhesive layer by thermocompression bonding the film-like adhesive described in the above item (5) to a back surface of a semiconductor wafer in which at least one semiconductor circuit is formed on a surface, and providing a dicing tape 3 via the adhesive layer;
a second step of dicing the semiconductor wafer and the adhesive layer simultaneously to obtain a semiconductor chip with an adhesive layer, the semiconductor chip with an adhesive layer including the semiconductor wafer and the adhesive layer on the dicing tape;
a third step of removing the dicing tape from the adhesive layer and thermocompression bonding the semiconductor chip with an adhesive layer and a wiring board via the adhesive layer; and
a fourth step of thermally curing the adhesive layer.

(8)
A semiconductor package wherein a semiconductor chip and a wiring board, or semiconductor chips are bonded with a thermally curable component of the film-like adhesive described in the above item (5).

The numerical ranges indicated with the use of the term "to" in the present invention refer to ranges including the numerical values before and after the term "to" respectively as the lower limit and the upper limit.

In the present invention, (meth)acryl means either or both of acryl and methacryl. The same applies to (meth)acrylate.

Advantageous Effects of Invention

The adhesive composition of the present invention is a composition that can suppress generation of voids after a die attach step even in a form of a thin film, exhibit high adhesive force between an adherend, and is suitable for providing a film-like adhesive exhibiting excellent thermal conductivity.

Further, the film-like adhesive of the present invention has the above excellent characteristics.

Further, the semiconductor package of the present invention has a film-like adhesive having the above excellent characteristics.

The production method of the present invention allows production of the film-like adhesive and the semiconductor package having the above excellent characteristics.

DESCRIPTION OF EMBODIMENTS

<<Adhesive Composition>>

Figure 1:
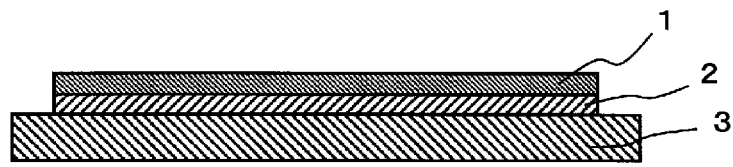
FIG. 1 is a schematic longitudinal cross-sectional view illustrating a preferred embodiment of a first step of a method of producing a semiconductor package of the present invention.

The adhesive composition of the present invention (hereinafter, also referred to as thermally conductive adhesive composition) contains an epoxy resin (A), an epoxy resin curing agent (B), a polymer component (C), and an inorganic filler (D), wherein
the inorganic filler (D) satisfies the following conditions (1) and (2); and
the proportion of the inorganic filler (D) in the total content of the epoxy resin (A), the epoxy resin curing agent (B), the polymer component (C), and the inorganic filler (D) is 20 to 70% by volume:
(1) an average particle diameter (d50) is 0.1 to 3.5 μm, and
(2) the ratio d90/d50 of the particle diameter at 90% cumulative distribution frequency (d90) to the average particle diameter (d50) is 5.0 or less.

In the present invention, the average particle diameter (d50) means a so-called median diameter, and refers to a particle diameter at which the cumulative volume is 50% when the particle size distribution is measured by the laser diffraction scattering method and the total volume of the particles is defined as 100% in the cumulative distribution. Also, the particle diameter at 90% cumulative distribution frequency (d90) means a particle diameter at which the cumulative volume is 90% when the total volume of the particles is defined as 100% in the cumulative distribution, similarly to the average particle diameter (d50). Specifically, these particle diameters are a value measured by the method described in Examples.

In a case of measuring the average particle diameter of the inorganic filler (D) contained in the thermally conductive adhesive composition, the inorganic filler (D) is separated from other components in the composition by, for example, a method of subjecting the adhesive composition to heat treatment at 300° C. or more to carbonize organic components and removing the organic components by washing, and then the separated inorganic filler (D) is measured according to the method described in Examples. The average particle diameter of the inorganic filler (D) contained in an adhesive obtained from the thermally conductive adhesive composition of the present invention (for example, a film-like adhesive described later) can also be measured in the same manner as in the average particle diameter of the inorganic filler (D) contained in the thermally conductive adhesive composition.

Here, the thermally conductive adhesive composition of the present invention can suppress aggregation of the inorganic filler (D) by dispersing the inorganic filler (D) in the composition during preparation of the composition. Therefore, even when the composition is stored for a predetermined period of time after preparation of the composition, the inorganic filler (D) can be dispersed again.

The thermally conductive adhesive composition of the present invention can be stably stored under a condition of 25° C. for 1 month or more. However, in consideration of the reactivity between the epoxy resin (A) and the epoxy resin curing agent (B), the thermally conductive adhesive composition is preferably refrigerated for storage at 10° C. or less. The film-like adhesive of the present invention described later can also be stored under the same condition.

The thermally conductive adhesive composition of the present invention contains an inorganic filler (D) having an average particle diameter (d50) defined in the above (1) of 0.1 to 3.5 μm, which is small, and satisfying particle size distribution where d90/d50 is 5.0 or less as defined in the above (2). With such a configuration, aggregation of the inorganic filler and inclusion of coarse particles caused by mixing with resin components containing the epoxy resin (A) and the polymer component (C) can be suppressed even when the inorganic filler has a small average particle diameter. Further, when the composition is formed into a film-like adhesive, aggregation of the inorganic filler and inclusion of coarse particles can be similarly suppressed. The reason for this is not clear, but it is presumed that, aggregates originally contained in the inorganic filler (D), which become the core of aggregation growth in the mixing with resin components in addition to coarse particles, are removed in a step of adjusting particle size distribution. As a result of this, an adhesive such as a film-like adhesive obtained from the thermally conductive adhesive composition of the present invention can suppress increase in melt viscosity and suppress generation of voids after a die attach step. Further, when the adhesive is formed in a film form, the surface of the adhesive becomes smooth, and whereby slight gaps between an adhesive layer (film-like adhesive) and an adherend, which are not detected as voids, can be eliminated. It is therefore conceived that such an adhesive can exhibit excellent adhesive force between the adherend.

The above d50 is preferably 0.2 to 3.3. Also, the above d90/d50 is preferably 4.5 or less, more preferably 4.2 or less, and even more preferably 4.0 or less.

Hereinafter, in the present specification, the epoxy resin (A) may be referred to as component (A), the epoxy resin curing agent (B) may be referred to as component (B), the polymer component (C) may be referred to as component (C), and the inorganic filler (D) may be referred to as component (D).

<Characteristics of Film-Like Adhesive>
(Melt Viscosity)

When a film-like adhesive obtained by using the thermally conductive adhesive composition of the present invention (hereinafter, also referred to as thermally conductive film-like adhesive) is heated at a temperature elevation rate of 5° C./min from 25° C., the melt viscosity at 70° C. preferably reaches a range of 6,000 to 50,000 Pa·s. This melt viscosity at 70° C. is more preferably a range of 6,000 to 45,000 Pa·s, and even more preferably a range of 6,000 to 40,000 Pa·s. By adjusting the melt viscosity at 70° C. to a level within the preferable range, generation of voids between the semiconductor wafer and the film-like adhesive and occurrence of protrusion failure of the film-like adhesive can be reduced when the film-like adhesive is bonded to the semiconductor wafer.

Also, when the thermally conductive film-like adhesive of the present invention is heated at a temperature elevation rate of 5° C./min from 25° C., the melt viscosity at 120° C. preferably reaches a range of 500 to 10,000 Pa·s. This melt viscosity at 120° C. is more preferably in a range of 800 to 9,000 Pa·s, and even more preferably in a range of 1,000 to 8,000 Pa·s. By adjusting the melt viscosity at 120° C. to a level within the preferable range, generation of voids between unevennesses in the wiring board and occurrence of protrusion failure of the film-like adhesive can be reduced when the semiconductor chip provided with the film-like adhesive is thermocompression bonded on the wiring board.

In the present invention, the melt viscosity is determined by measuring change in viscosity resistance in a temperature range of 25 to 200° C. at a temperature elevation rate of 5° C./min from 25° C. for a thermally conductive film-like adhesive before thermal curing, by using a rheometer (trade name: RS6000, manufactured by Haake) and then calculating the melt viscosities at 70° C. and 120° C. from the obtained temperature-viscosity resistance curve. Specifically, the measurement method described in examples can be used as a reference.

Here, the thermally conductive film-like adhesive before thermal curing in the measurement of the melt viscosity means a thermally conductive film-like adhesive that is not exposed under a temperature condition of 25° C. or more over 1 month or more.

The melt viscosity can be adjusted to the above range by the content of the inorganic filler (D), further, the type of the inorganic filler (D), and the type or content of the compound or resin in which the epoxy resin (A), the epoxy resin curing agent (B), the polymer component (C), and the like coexist.

(Thermal Conductivity)

In the thermally conductive film-like adhesive of the present invention, the thermal conductivity after thermal curing is preferably 1.0 W/m·K or more. The thermal conductivity is more preferably 1.5 W/m·K or more. When the thermal conductivity is less than the preferable lower limit, there is a tendency that generated heat is less likely to be released to outside of the package. The thermally conductive film-like adhesive of the present invention exhibits such excellent thermal conductivity after thermal curing. Thus, a semiconductor package having improved heat dissipation efficiency to outside of the semiconductor package can be obtained by firmly bonding the thermally conductive film-like adhesive of the present invention to an adherend such as a semiconductor wafer and a wiring board, followed by thermally curing.

The upper limit of the thermal conductivity is not particularly limited, but is practically, 7.0 W/m·K or less, more preferably 6.5 W/m·K or less, and also preferably 5.0 W/m·K or less.

Here, the expression "after thermal curing in the measurement of thermal conductivity" means a state in which curing of thermosetting resin has been completed. Specifically, it is a state in which no heat reaction peak is observed when DSC (Differential Scanning calorimeter) measurement is performed at a temperature elevation rate of 10° C./min.

In the present invention, such a thermal conductivity of the film-like adhesive after thermal curing refers to a value obtained by measuring the thermal conductivity by using a thermal conductivity measurement apparatus (trade name: HC-110, manufacture by Eko Instruments Co., Ltd) according to the heat flow meter method (in accordance with JIS-A1412). Specifically, the measurement method described in examples can be used as a reference.

The thermal conductivity can be adjusted to the above range by the content of the inorganic filler (D), further, the type of the inorganic filler (D), and the type or content of the compound or resin in which the epoxy resin (A), the epoxy resin curing agent (B), the polymer component (C), and the like coexist.

The thermally conductive film-like adhesive of the present invention also has an insulating property as characteristics thereof.

<Epoxy Resin (A)>

The epoxy resin (A) can be used without any particularly limitation as long as it is a thermosetting resin having an epoxy group, and may be any of liquid, solid, and semi-solid. The liquid in the present invention means that the softening point is less than 25° C. The solid means that the softening point is 60° C. or more. The semi-solid means that the softening point is between the softening point of the liquid and the softening point of the solid (25° C. or more and less than 60° C.). As the epoxy resin (A) used in the present invention, the softening point is preferably 100° C. or less from the viewpoint of being capable of obtaining a film-like adhesive that can reach low melt viscosity in a preferable temperature range (for example, 60 to 120° C.). Incidentally, in the present invention, the softening point is a value measured by the softening point test (ring and ball) method (measurement condition: in accordance with JIS-2817).

In the epoxy resin (A) used in the present invention, the epoxy equivalent is preferably 500 g/eq or less, and more preferably 150 to 450 g/eq from the viewpoint of increasing the crosslinking density of a cured product, and as a result, increasing the contact ratio between blended inorganic fillers (D) and the contact area between inorganic fillers (D), thus providing higher thermal conductivity. Incidentally, in the present invention, the epoxy equivalent refers to the number of grams of a resin containing 1 gram equivalent of epoxy group (g/eq).

The mass average molecular weight of the epoxy resin (A) is usually preferably less than 10,000, and more preferably 5,000 or less. The lower limit is not particularly limited, but is practically 300 or more.

The mass average molecular weight is a value obtained by GPC (Gel Permeation Chromatography) analysis.

Examples of the skeleton of the epoxy resin (A) include a phenol novolac type, an orthocresol novolac type, a cresol novolac type, a dicyclopentadiene type, a biphenyl type, a fluorene bisphenol type, a triazine type, a naphthol type, a naphthalene diol type, a triphenylmethane type, a tetraphenyl type, a bisphenol A type, a bisphenol F type, a bisphenol AD type, a bisphenol S type, a trimethylolmethane type, and the like. Among them, a triphenylmethane type, a bisphenol A type, a cresol novolac type, and an orthocresol novolac type are preferable from the viewpoint of being capable of obtaining a film-like adhesive having low resin crystallinity and good appearance.

The content of the epoxy resin (A) is preferably 3 to 30 parts by mass, and more preferably 5 to 30 parts by mass per 100 parts by mass of the total content of components constituting the film-like adhesive (specifically, components other than a solvent) in the thermally conductive adhesive composition of the present invention. The thermal conductivity of the film-like adhesive can be improved by adjusting the content to the preferable lower limit or more. On the other hand, by adjusting the content to the preferable upper limit or less, generation of oligomer components can be suppressed, and the state of the film (for example, film tack property) can be prevented from changing with small change in temperature.

<Epoxy Resin Curing Agent (B)>

As the epoxy resin curing agent (B), optional curing agents such as amines, acid anhydrides, and polyhydric phenols can be used. In the present invention, a latent curing agent is preferably used from the viewpoint of allowing the epoxy resin (A) and the polymer component (C) to have a low melt viscosity, and being capable of providing a thermally conductive adhesive composition that exhibits curability at a high temperature more than a certain temperature, has rapid curability, and further has high storage stability that enables long-term storage at room temperature.

Examples of the latent curing agent include a dicyandiamide, an imidazole, a curing catalyst-complex polyhydric phenol, a hydrazide, a boron trifluoride-amine complex, an aminimide, a polyamine salt, and modified products or microcapsules thereof. In the present invention, it is more preferable to use an imidazole from the viewpoint of adjusting the melt viscosity at 70° C. and the melt viscosity at 120° C. of the thermally conductive film-like adhesive to satisfy the above preferable ranges.

These may be used alone, or in combination of two or more types thereof.

The content of the epoxy resin curing agent (B) per 100 parts by mass of the epoxy resin (A) is preferably 0.5 to 100 parts by mass, and more preferably 1 to 80 parts by mass. By adjusting the content to the preferable lower limit or more, the curing time can be reduced. On the other hand, by adjusting the content to the preferable upper limit or less, failures in a reliability test conducted after the film-like adhesive is incorporated into the semiconductor caused by excessive curing agent remaining in the film-like adhesive absorbing moisture can be reduced.

<Polymer Component (C)>

The polymer component (C) has only to be a component that suppresses a film tack property at normal temperature (25° C.) (property that the film state is likely to change by even a little temperature change) and imparts sufficient adhesiveness and film formability (film forming property) when the film-like adhesive is formed. Examples of the polymer component (C) include natural rubber, butyl rubber, isoprene rubber, chloroprene rubber, an ethylene-vinyl acetate copolymer, an ethylene-(meth)acrylic acid copolymer, an ethylene-(meth)acrylic acid ester copolymer, polybutadiene resin, polycarbonate resin, thermoplastic polyimide resin, polyamide resins such as 6-nylon and 6,6-nylon, phenoxy resin, (meth)acrylic resin, polyester resins such as polyethylene terephthalate and polybutylene terephthalate, polyamideimide resin, fluororesin, and the like. These polymer components (C) may be used alone, or in combination of two or more types thereof.

The mass average molecular weight of the polymer component (C) is 10,000 or more. The upper limit is not particularly limited, but is practically 5,000,000 or less.

The mass average molecular weight of the polymer component (C) is a value determined by GPC [Gel Permeation Chromatography] in terms of polystyrene. Hereinafter, the value of the mass average molecular weight of the specific polymer component (C) has the same meaning.

The glass transition temperature (Tg) of the polymer component (C) is preferably less than 100° C., and more preferably less than 90° C. The lower limit is preferably 0° C. or more, and more preferably 10° C. or more.

The glass transition temperature of the polymer component (C) is a glass transition temperature measured by DSC at a temperature elevation rate of 0.1° C./min. Hereinafter, the value of the glass transition temperature of the specific polymer component (C) has the same meaning.

Note that, in the present invention, with regard to a resin which can have an epoxy group such as phenoxy resin among the epoxy resin (A) and the polymer component (C), a resin having an epoxy equivalent of 500 g/eq or less is classified into the epoxy resin (A) and a resin which does not correspond to the above resin is classified into the component (C).

In the present invention, among these polymer components (C), at least one type of phenoxy resin is preferably used. The phenoxy resin has a structure similar to that of the epoxy resin (A), and thus has favorable compatibility with the epoxy resin (A). The phenoxy resin has low resin melt viscosity and exhibits excellent effect on adhesiveness. Also, the phenoxy resin has high heat resistance and small saturated water absorption, and thus is preferable from the viewpoint of ensuring the reliability of the semiconductor package. Further, the phenoxy resin is preferable in view of eliminating a tack property and brittleness at normal temperature.

The phenoxy resin can be obtained by a reaction of a bisphenol or biphenol compound with epihalohydrin such as epichlorohydrin, or a reaction of liquid epoxy resin with a bisphenol or biphenol compound.

In any of the reactions, the bisphenol or biphenol compound is preferably a compound represented by the following formula (A).

[Formula 1]

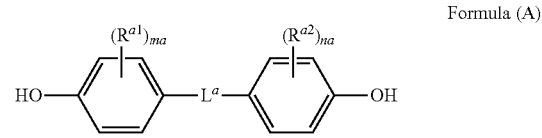

Formula (A)

In the formula (A), $L^a$ designates a single bond or divalent linking group, and $R^{a1}$ and $R^{a2}$ each independently designates a substituent. ma and na each independently designate an integer of 0 to 4.

In $L^a$, a divalent linking group is preferably an alkylene group, a phenylene group, —O—, —S—, —SO—, —SO$_2$—, or a group in which an alkylene group and a phenylene group are combined.

The number of carbon atoms of the alkylene group is preferably 1 to 10, more preferably 1 to 6, even more preferably 1 to 3, particularly preferably 1 or 2, and most preferably 1.

The alkylene group is preferably —C(R$^\alpha$)(R$^\beta$)—, and here, R$^\alpha$ and R$^\beta$ each independently designate a hydrogen atom, an alkyl group, and an aryl group. R$^\alpha$ and R$^\beta$ may be bonded to each other to form a ring. R$^\alpha$ and R$^\beta$ are preferably a hydrogen atom or an alkyl group (for example, methyl, ethyl, isopropyl, n-propyl, n-butyl, isobutyl, hexyl, octyl, and 2-ethylhexyl). The alkylene group is, in particular, preferably —CH$_2$—, —CH(CH$_3$)—, or C(CH$_3$)$_2$—, more preferably —CH$_2$— or —CH(CH$_3$)—, and even more preferably —CH$_2$—.

The number of carbon atoms of the phenylene group is preferably 6 to 12, more preferably 6 to 8, and even more preferably 6. Examples of the phenylene group include p-phenylene, m-phenylene, and o-phenylene. Among these, p-phenylene and m-phenylene are preferable.

The group in which an alkylene group and a phenylene group are combined is preferably an alkylene-phenylene-alkylene group, and more preferably —C(R$^\alpha$)(R$^\beta$)-phenylene-C(R$^\alpha$)(R$^\beta$)—.

The ring formed by bonding of R$^\alpha$ and R$^\beta$ is preferably a 5- or 6-membered ring, more preferably a cyclopentane ring or a cyclohexane ring, and even more preferably a cyclohexane ring.

$L^a$ is preferably a single bond or an alkylene group, —O—, or —SO$_2$—, and more preferably an alkylene group.

In $R^{a1}$ and $R^{a2}$, the substituent is preferably an alkyl group, an aryl group, an alkoxy group, an alkylthio group, or a halogen atom, and more preferably an alkyl group, an aryl group, or a halogen atom, and even more preferably an alkyl group.

ma and na are preferably 0 to 2, more preferably 0 or 1, and even more preferably 0.

[Formula 3]

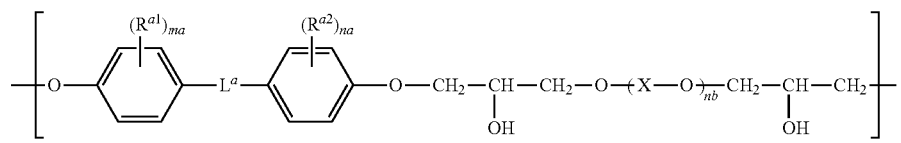

Formula (I)

Examples of the bisphenol or biphenol compound include bisphenol A, bisphenol AD, bisphenol AP, bisphenol AF, bisphenol B, bisphenol BP, bisphenol C, bisphenol E, bisphenol F, bisphenol G, bisphenol M, bisphenol S, bisphenol P, bisphenol PH, bisphenol TMC, bisphenol Z, 4,4'-biphenol, 2,2'-dimethyl-4,4'-biphenol, 2,2',6,6'-tetramethyl-4,4'-biphenol, cardo skeleton type bisphenol, and the like. Bisphenol A, bisphenol AD, bisphenol C, bisphenol E, bisphenol F, and 4,4'-biphenol are preferable, and bisphenol A, bisphenol E, and bisphenol F are more preferable, and bisphenol A is particularly preferable.

Meanwhile, the liquid epoxy resin is preferably diglycidyl ether of an aliphatic diol compound, and is more preferably a compound represented by the following formula (B).

[Formula 2]

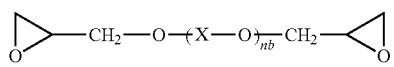

Formula (B)

In the formula (B), X designates an alkylene group, and nb designates an integer of 1 to 10.

The number of carbon atoms of the alkylene group is preferably 2 to 10, more preferably 2 to 8, even more preferably 3 to 8, particularly preferably 4 to 6, and most preferably 6.

Examples of the alkylene group include ethylene, propylene, butylene, pentylene, hexylene, and octylene. Ethylene, trimethylene, tetramethylene, pentamethylene, heptamethylene, hexamethylene, and octamethylene are preferable.

nb is preferably 1 to 6, more preferably 1 to 3, and even more preferably 1.

Here, when nb is 2 to 10, X is preferably ethylene or propylene, and even more preferably ethylene.

Examples of the aliphatic diol compound in diglycidyl ether include ethylene glycol, propylene glycol, diethylene glycol, triethylene glycol, polyethylene glycol, 1,3-propanediol, 1,4-butanediol, 1,5-heptanediol, 1,6-hexanediol, 1,7-pentanediol, and 1,8-octanediol.

In the above reaction, the phenoxy resin is a phenoxy resin obtained by reacting a single bisphenol or biphenol compound, or aliphatic diol compound, and may be a phenoxy resin obtained by mixing and reacting two or more types of bisphenol or biphenol compound, or aliphatic diol compound. For example, a reaction of diglycidyl ether of 1,6-hexanediol with a mixture of bisphenol A and bisphenol F is exemplified.

The phenoxy resin in the present invention is preferably a phenoxy resin obtained by a reaction of a liquid epoxy resin with a bisphenol or biphenol compound, and more preferably a phenoxy resin having a repeating unit represented by the following formula (I).

In the formula (I), $L^a$, $R^{a1}$, $R^{a2}$, ma, and na are synonymous with $L^a$, $R^{a1}$, $R^{a2}$, ma, and na in the formula (A), and the preferable ranges are also the same. X and nb are synonymous with X and nb in the formula (B), and the preferable ranges are also the same.

In the present invention, a polymer of bisphenol A and diglycidyl ether of 1,6-hexanediol is preferable among these substances.

The mass average molecular weight of the phenoxy resin is preferably 10,000 or more, and more preferably 10,000 to 100,000.

Further, the amount of epoxy group remaining in a small amount in the phenoxy resin is preferably 5,000 g/eq or more in epoxy equivalent.

The glass transition temperature (Tg) of the phenoxy resin is preferably less than 100° C., and more preferably less than 90° C. The lower limit is preferably 0° C. or more, and more preferably 10° C. or more.

The phenoxy resin may be synthesized by the above method, or a commercially available product may be used. Examples of the commercially available product include YX7180 (trade name: bisphenol F+1,6-hexanediol diglycidyl ether type phenoxy resin, manufactured by Mitsubishi Chemical Corporation), 1256 (trade name: bisphenol A type phenoxy resin, manufactured by Mitsubishi Chemical Corporation), YP-50 (trade name: bisphenol A type phenoxy resin, manufactured by NSCC Epoxy Manufacturing Co., Ltd.), YP-70 (trade name: bisphenol A/F type phenoxy resin, manufactured by NSCC Epoxy Manufacturing Co., Ltd.), FX-316 (trade name: bisphenol F type phenoxy resin, manufactured by NSCC Epoxy Manufacturing Co., Ltd.), and FX-280S (trade name: cardo skeleton type phenoxy resin, manufactured by NSCC Epoxy Manufacturing Co., Ltd.), 4250 (trade name: bisphenol A type/F type phenoxy resin, manufactured by Mitsubishi Chemical Corporation), and the like.

As the (meth)acrylic resin, a resin composed of a (meth)acrylic copolymer, which is known more than before, is used.

The mass average molecular weight of the (meth)acrylic copolymer is preferably 10,000 to 2,000,000, and more preferably 100,000 to 1,500,000. By adjusting the mass average molecular weight to a level within the preferable range, a tack property can be reduced and increase in the melt viscosity can also be suppressed.

The glass transition temperature of the (meth)acrylic copolymer is preferably in a range of −10° C. to 50° C., more preferably 0° C. to 40° C., and even more preferably 0° C. to 30° C. By adjusting the glass transition temperature to a level within the preferable range, a tack property can be reduced and generation of voids between the semiconductor wafer and the film-like adhesive, and the like can be suppressed.

Examples of the (meth)acrylic resin include poly(meth) acrylic acid esters and derivatives thereof. Examples thereof include copolymers containing, as a monomer component, 2-hydroxyethyl acrylate, 2-hydroxyethyl methacrylate, 2-hydroxypropyl acrylate, 2-hydroxypropyl methacrylate, acrylic acid, methacrylic acid, itaconic acid, glycidylmethacrylate, glycidylacrylate, and the like. Examples of the monomer component that is used also include (meth)acrylic acid esters having a cyclic skeleton, such as (meth)acrylic acid cycloalkyl ester, (meth)acrylic acid benzyl ester, isobornyl (meth)acrylate, dicyclopentanyl (meth)acrylate, dicyclopentenyl (meth)acrylate, and dicyclopentenyloxyethyl (meth)acrylate, and imide (meth)acrylate; and (meth)acrylic acid alkyl esters having 1 to 18 carbon atoms in an alkyl group, such as methyl(meth)acrylate, ethyl(meth)acrylate, propyl(meth)acrylate, and butyl(meth)acrylate. Also, these monomer components may be copolymerized with vinyl acetate, (meth)acrylonitrile, styrene, or the like. Further, a (meth)acrylic resin having a hydroxy group is preferable because compatibility with the epoxy resin is favorable.

The content of the polymer component (C) per 100 parts by mass of the epoxy resin (A) is preferably 1 to 40 parts by mass, more preferably 5 to 35 parts by mass, and even more preferably 10 to 30 parts by mass. The rigidity and flexibility of the thermally conductive film-like adhesive before curing can be controlled by adjusting the content to such a range. The state of the film becomes favorable (film tack property is reduced), and thus film brittleness can also be suppressed.

<Inorganic Filler (D)>

The inorganic filler (D) is not particularly limited as long as it is an inorganic filler that satisfies definitions of the average particle diameter (d50) of the above (1) and d90/d50 of the above (2) and has thermal conductivity. In the present invention, the inorganic filler (D) contributes to imparting thermal conductivity to the film-like adhesive.

The inorganic filler (D) that satisfies provisions of the average particle diameter (d50) of the above (1) and d90/d50 of the above (2) can be prepared by, for example, filtering an optional inorganic filler using a mesh filter having an appropriate diameter.

The inorganic filler having thermal conductivity is a particle made of a thermally conductive material or a particle whose surface is coated with the thermally conductive material. The thermal conductivity of the thermally conductive material is preferably 12 W/m·K or more, and more preferably 30 W/m·K or more.

When the thermal conductivity of the thermally conductive material is the preferable lower limit or more, the amount of the inorganic filler (D) blended in order to obtain a desired thermal conductivity can be reduced. This suppresses increase in the melt viscosity of the adhesive film, and improves the filling property of the film into the unevenness of the substrate at the time of compression bonding to the substrate, thus enabling to suppress generation of voids.

In the present invention, the thermal conductivity of the thermally conductive material means the thermal conductivity at 25° C., and the literature value for each material can be used. In a case where there is no description in the literates, for example, the value measured in accordance with JIS R 1611 can be used in the case of ceramics, or the value measured in accordance with JIS H 7801 can be used in the case of metals in substitution for the literature value.

Examples of the inorganic filler (D) include thermally conductive ceramics, and preferred examples thereof include alumina particles (thermal conductivity: 36 W/m·K), aluminum nitride particles (thermal conductivity: 150 to 290 W/m·K), boron nitride particles (thermal conductivity: 60 W/m·K), zinc oxide particles (thermal conductivity: 54 W/m·K), a silicon nitride filler (thermal conductivity: 27 W/m·K), silicon carbide particles (thermal conductivity: 200 W/m·K), and magnesium oxide particles (thermal conductivity: 59 W/m·K).

In particular, alumina particles having high thermal conductivity are preferable in terms of dispersibility and availability. Further, aluminum nitride particles and boron nitride particles are preferable from the viewpoint of having even higher thermal conductivity than that of alumina particles. In the present invention, alumina particles and aluminum nitride particles are preferable among these particles.

Further, the inorganic filler (D) include particles whose surfaces are coated with a metal having thermal conductivity. Preferred examples of such particles include silicone resin particles and acrylic resin particles whose surfaces are coated with metals such as silver (thermal conductivity: 429 W/m·K), nickel (thermal conductivity: 91 W/m·K), gold (thermal conductivity: 329 W/m·K), and the like.

In particular, silicone resin particles whose surfaces are coated with silver are preferable from the viewpoint of a stress relaxing property and high heat resistance.

The inorganic filler (D) may be subjected to surface treatment or surface modification. Examples of such a surface treatment and surface modification include a treatment with a silane coupling agent, phosphoric acid or a phosphoric acid compound, or a surfactant. Besides the items described in the present specification, the descriptions of a silane coupling agent, or phosphoric acid or a phosphoric acid compound, and a surfactant in the section of a thermally conductive filler in WO 2018/203527 or the section of an aluminum nitride filler in WO 2017/158994 can be applied, for example.

A method of blending the inorganic filler (D) to resin components such as the epoxy resin (A), the epoxy resin curing agent (B), and the polymer component (C) includes a method in which a powder inorganic filler and, as necessary, a silane coupling agent, phosphoric acid or a phosphoric acid compound, and a surfactant are directly blended (integral blending method), or a method in which a slurry inorganic filler obtained by dispersing an inorganic filler treated with a surface treatment agent such as a silane coupling agent, phosphoric acid or a phosphoric acid compound, and a surfactant in an organic solvent is blended.

A method of subjecting the inorganic filler (D) to treatment with the silane coupling agent is not particularly limited. Examples thereof include a wet method of mixing the inorganic filler (D) and the silane coupling agent in a solvent, a dry method of subjecting the inorganic filler (D) and the silane coupling agent to treatment in the gas phase, the above integral blending method, and the like.

In particular, the aluminum nitride particles contribute to high thermal conductivity, but tend to generate ammonium ions due to hydrolysis. It is therefore preferable that the aluminum nitride particles are used in combination with a phenol resin having a low moisture absorption rate and hydrolysis is suppressed by surface modification. As a surface modification method of the aluminum nitride, a method of providing a surface layer with an oxide layer of aluminum oxide to improve water proofness and then preforming surface treatment with phosphoric acid or a phosphoric acid compound to improve affinity with the resin is particularly preferable.

It is also preferable to subject the surface of the inorganic filler (D) to treatment with a silane coupling agent.

In addition, it is also preferable to additionally use an ion trapping agent in combination.

The silane coupling agent is a compound in which at least one hydrolyzable group such as an alkoxy group and an aryloxy group is bonded to a silicon atom. In addition to these groups, an alkyl group, an alkenyl group, and an aryl group may be bonded to the silicon atom. The alkyl group is preferably an alkyl group substituted with an amino group, an alkoxy group, an epoxy group, or a (meth)acryloyloxy group, and more preferably an alkyl group substituted with an amino group (preferably, a phenylamino group), an alkoxy group (preferably, a glycidyloxy group), or a (meth) acryloyloxy group.

Examples of the silane coupling agent include 2-(3,4-epoxycyclohexyl)ethyltrimethoxysilane, 3-glycidyloxypropyltrimethoxysilane, 3-glycidyloxypropyltriethoxysilane, 3-glycidyloxypropylmethyldimethoxysilane, 3-glycidyloxypropyl methyldiethoxysilane, dimethyldimethoxysilane, dimethyldiethoxysilane, methyltrimethoxysilane, methyltriethoxysilane, phenyltrimethoxysilane, phenyltriethoxysilane, N-phenyl-3-aminopropyltrimethoxysilane, 3-methacryloyloxypropylmethyldimethoxysilane, 3-methacryloyloxypropyltrimethoxysilane, 3-methacryloyloxypropylmethyldiethoxysilane, 3-methacryloyloxypropyltriethoxysilane, and the like.

The silane coupling agent or the surfactant is preferably contained in an amount of 0.1 to 2.0 parts by mass per 100 parts by mass of the inorganic filler (D).

By adjusting the content of the silane coupling agent or the surfactant to the preferable range, peeling at the adhesion interface due to volatilization of an excessive silane coupling agent and surfactant in the heating process in semiconductor assembling (for example, a reflow process) can be suppressed while aggregation of the inorganic filler (D) is suppressed. As a result, generation of voids can be suppressed and adhesiveness can be improved.

The shape of the inorganic filler (D) is not particularly limited as long as it satisfies the average particle diameter (d50) defined in the above (1) and the particle size distribution defined in the above (2). Examples thereof include a flake shape, a needle shape, a filament shape, a spherical shape, and a scale shape, but a spherical particle is preferable from the viewpoint of achieving higher filling and fluidity.

In the present invention, the proportion of the inorganic filler (D) in the total content of the epoxy resin (A), the epoxy resin curing agent (B), the polymer component (C), and the inorganic filler (D) is 20 to 70% by volume. The content proportion of the inorganic filler (D) being the lower limit or more can impart a desired thermal conductivity and melt viscosity to the film-like adhesive, and thus can provide a heat dissipation effect from the semiconductor package and suppress protrusion failure of the film-like adhesive. Also, the content proportion of the inorganic filler (D) being the upper limit or less can impart a desired melt viscosity to the film-like adhesive, and thus can suppress generation of voids. Further, such a content proportion allows relaxing of internal stress generated in the semiconductor package during thermal change, and also allows improvement of an adhesive force.

The proportion of the inorganic filler (D) in the total content of the components (A) to (D) is preferably 25 to 70% by volume, more preferably 30 to 70% by volume, even more preferably 30 to 60% by volume, and even more preferably 30 to 50% by volume.

The content of the inorganic filler (D) (% by volume) can be calculated from the content mass and the specific gravity of each of the components (A) to (D).

<Other Additives>

In addition to the epoxy resin (A), the epoxy resin curing agent (B), the polymer component (C), and the inorganic filler (D), the adhesive composition of the present invention may further contain additives such as an organic solvent (MEK or the like), an ion trapping agent (ion capturing agent), a curing catalyst, a viscosity adjusting agent, an antioxidant, a flame retardant, a coloring agent, a stress relaxing agent such as butadiene-series rubber and silicone rubber, as long as the effect of the present invention is not inhibited. For example, the description of other additives in WO 2017/158994 can be applied.

The proportion of the total content of the epoxy resin (A), the epoxy resin curing agent (B), the polymer component (C), and the inorganic filler (D) in the adhesive composition of the present invention is not particularly limited as long as the film-like adhesive of the present invention can be obtained. The proportion can be, for example, 60 to 95% by mass, and is preferably 70 to 90% by mass.

The adhesive composition of the present invention can be suitably used for obtaining the film-like adhesive of the present invention. However, the adhesive composition of the present invention is not limited to the film-like adhesive, and can also be suitably used for a liquid adhesive.

<<Film-Like Adhesive and Production Method Thereof>>

The film-like adhesive of the present invention is a film-like adhesive obtained from the adhesive composition of the present invention, and contains the epoxy resin (A), the epoxy resin curing agent (B), the polymer component (C), and the inorganic filler (D). Among the additives described as other additives in the thermally conductive adhesive composition of the present invention, the additives other than the organic solvent in addition to the above components may be contained.

Here, the "film" means a thin film having a thickness of 200 μm or less. The shape, size and the like of the film is not particularly limited, and can be appropriately adjusted according to the use form.

The film-like adhesive of the present invention may be formed from the film-like adhesive of the present invention alone, or may be a form obtained by bonding a release-treated substrate film described below to at least one surface of the film-like adhesive. The film-like adhesive of the present invention may be a form obtained by cutting the film into an appropriate size, or a form obtained by winding the film into a roll form.

A preferred embodiment of the method of producing a film-like adhesive of the present invention is a method of applying a thermally conductive adhesive composition of the present invention onto one surface of a release-treated substrate film and drying the composition by heating, but the embodiment is not particularly limited to this method. The above heat drying is performed for the purpose of removing the solvent to form a film-like adhesive.

As the release-treated substrate film, any release-treated substrate film that functions as a cover film of the obtained film-like adhesive can be used, and a publicly known film can be appropriately employed. Examples thereof include release-treated polypropylene (PP), release-treated polyethylene (PE), and release-treated polyethylene terephthalate (PET). A publicly known method can be appropriately employed as the application method, and examples thereof include methods using a roll knife coater, a gravure coater, a die coater, a reverse coater, and the like.

The thickness of the film-like adhesive of the present invention thus obtained is not particularly limited. However, the thickness is preferably 1 to 200 μm, and more preferably 1 to 40 μm from the viewpoint of being capable of more sufficiently embedding the film-like adhesive in the wiring board and the unevenness of the semiconductor chip surface. When the thickness is less than the preferable lower limit, the film-like adhesive cannot be sufficiently embedded in the wiring board and the unevenness of the semiconductor chip surface, and thus there is a tendency that sufficient adhesiveness cannot be ensured. On the other hand, when the thickness is more than the preferable upper limit, it becomes difficult to remove the organic solvent in the production, and thus the amount of the remaining solvent increases, resulting in tendency of increased film tack property. From the viewpoint of further exhibiting the effects of the present invention, such as exhibiting excellent thermal conductivity, suppressing generation of voids, and exhibiting excellent adhesive force as a thin thermally conductive film-like adhesive, the thickness of the film-like adhesive is more preferably 1 μm or more and less than 10 μm.

The thickness of the film-like adhesive is a value measured by a contact type linear gauge method (desk-top contact type thickness measurement apparatus).

In the thermally conductive film-like adhesive of the present invention, the arithmetic average roughness Ra of at least one surface thereof (that is, at least one surface to be bonded to an adherend) is preferably 3.0 μm or less, and the arithmetic average roughness Ra of surfaces on both sides to be bonded to the adherend is more preferably 3.0 μm or less.

The arithmetic average roughness Ra is more preferably 2.0 μm or less, and even more preferably 1.5 μm or less. The lower limit is not particularly limited, but is practically 0.1 μm or more.

According to the method of producing a film-like adhesive, a film-like adhesive in which the arithmetic average roughness Ra of the surface thereof satisfies the preferable range can be produced. For example, according to the method of applying a thermally conductive adhesive composition of the present invention onto one surface of a release-treated substrate film and drying the composition by heating, in the obtained film-like adhesive, the arithmetic average roughness Ra of a side of a surface in contact with the release-treated substrate film is ordinarily smaller than the arithmetic average roughness Ra of a side of an exposed surface of the film-like adhesive.

It is conceived that the film-like adhesive of the present invention can satisfy the above arithmetic average roughness Ra by using the inorganic filler (D), particularly even in a case where it is a thin film having a film thickness of less than 10 μm. As a result, the film-like adhesive of the present invention can achieve an adhesion state where generation of voids between the wiring board and the unevenness of the semiconductor chip surface is suppressed, and further, exhibit excellent adhesiveness.

The arithmetic average roughness Ra is measured by the method described in Examples to be mentioned later.

<<Semiconductor Package and Production Method Thereof>>

Then, preferred embodiments of a semiconductor package and a method of producing the semiconductor package of the present invention will be described in detail with reference to the drawings. Note that, in the descriptions and drawings below, the same reference numerals are given to the same or corresponding components, and overlapping descriptions will be omitted. FIGS. 1 to 7 are schematic longitudinal cross-sectional views each illustrating a preferred embodiment of each step of a method of producing a semiconductor package of the present invention.

In the method of producing a semiconductor package of the present invention, as a first step, as illustrated in FIG. 1, firstly, the film-like adhesive of the present invention is thermocompression bonded to the back surface of a semiconductor wafer 1 in which at least one semiconductor circuit is formed on the surface (that is, a surface of the semiconductor wafer 1 on which the semiconductor circuit is not formed) to provide an adhesive layer 2, and then the semiconductor wafer 1 and a dicing tape 3 are provided with the adhesive layer 2 interposed therebetween. At this time, a product in which the adhesive layer 2 and the dicing tape 3 are combined may also be thermocompression bonded simultaneously. The condition for thermocompression bonding is not particularly limited as long as the effect of the present invention is not impaired due to thermal curing of the epoxy resin (A), and a condition of a temperature of 70° C. and a pressure of 0.3 MPa is exemplified.

As the semiconductor wafer 1, a semiconductor wafer in which at least one semiconductor circuit is formed on the surface can be appropriately used. Examples of such a wafer include a silicon wafer, a SiC wafer, and a GaN wafer. As the adhesive layer 2, one layer of the thermally conductive film-like adhesive of the present invention may be used alone, or two or more layers thereof may be laminated and used. As a method of providing such an adhesive layer 2 on the back surface of the wafer 1, a method capable of laminating the film-like adhesive on the back surface of the semiconductor wafer 1 can be appropriately employed. Examples thereof include a method of bonding the film-like adhesive to the back surface of the semiconductor wafer 1 and then, in a case of laminating two or more layers, sequentially laminating the film-like adhesives to a desired thickness, a method of laminating the film-like adhesives to a desired thickness in advance and then bonding this to the back surface of the semiconductor wafer 1, and the like. An apparatus used when such an adhesive layer 2 is provided on the back surface of the semiconductor wafer 1 is not particularly limited. For example, a publicly known apparatus such as a roll laminator and a manual laminator can be appropriately used.

Figure 2:
FIG. 2 is a schematic longitudinal cross-sectional view illustrating a preferred embodiment of a second step of a method of producing a semiconductor package of the present invention.

Then, as a second step, the semiconductor wafer 1 and the adhesive layer 2 are simultaneously diced as illustrated in FIG. 2. Thus, a semiconductor chip 5 with an adhesive layer, including the semiconductor wafer 1 and the adhesive layer 2 on the dicing tape 3 is obtained. The dicing tape 3 is not particularly limited, and a publicly known dicing tape can be appropriately used. Further, an apparatus used for dicing is not particularly limited, and a publicly known dicing apparatus can be appropriately used.

Figure 3:
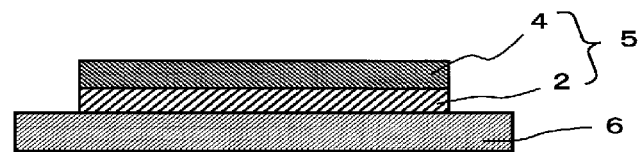
FIG. 3 is a schematic longitudinal cross-sectional view illustrating a preferred embodiment of a third step of a method of producing a semiconductor package of the present invention.

Then, as a third step, as illustrated in FIG. 3, the dicing tape 3 is removed from the adhesive layer 2, and then the semiconductor chip 5 with an adhesive layer and the wiring board 6 are thermocompression bonded via the adhesive layer 2 to mount the semiconductor chip 5 with an adhesive layer on the wiring board 6. As the wiring board 6, a substrate in which a semiconductor circuit is formed on the surface can be appropriately used. Examples of such a substrate include a print circuit board (PCB), various lead frames, and a substrate in which electronic components such as a resistive element and a capacitor are mounted on the surface of the substrate.

A method of mounting the semiconductor chip 5 with an adhesive layer on such a wiring board 6 is not particularly limited. A conventional method that enables to bond the semiconductor chip 5 with an adhesive layer to the wiring board 6 or the electronic component mounted on the surface of the wiring board 6 by utilizing the adhesive layer 2 can be appropriately employed. Examples of such a mounting method include publicly known heating and pressurizing methods such as a method using a mounting technique using a flip chip bonder having a heating function from the upper part, a method using a die bonder having a heating function from only the lower part, and a method using a laminator.

As such, mounting the semiconductor chip 5 with an adhesive layer on the wiring board 6 via the adhesive layer 2 formed from the film-like adhesive of the present invention allows the film-like adhesive to conform to the unevenness on the wiring board 6, formed due to the electronic component, and thereby enables to firmly adhere and fix the semiconductor chip 4 and the wiring board 6.

Then, as a fourth step, the film-like adhesive of the present invention is thermally cured. The temperature for thermal curing is not particularly limited as long as it is a temperature equal to or more than the thermal curing start temperature of the film-like adhesive of the present invention. The temperature varies depending on the type of the epoxy resin (A), the polymer component (C), and the epoxy curing agent (B) to be used. The temperature is, although it cannot be said unconditionally, for example, preferably 100 to 180° C., and more preferably 140 to 180° C. from the viewpoint that curing at higher temperature allows curing in a short time. When the temperature is less than the thermal curing start temperature, thermal curing does not sufficiently proceed, and as a result, the strength of the adhesion layer 2 tends to decrease. On the other hand, when the temperature is more than the above upper limit, the epoxy resin, the curing agent, the additives, and the like in the film-like adhesive volatilize during the curing process and thus tend to foam. Also, the time for curing treatment is preferably, for example, 10 to 120 minutes. In the present invention, by thermally curing the film-like adhesive at high temperature, a semiconductor package in which the wiring board 6 and the semiconductor chip 4 are firmly bonded can be obtained without generating voids even when the film-like adhesive is cured at high temperature.

Figure 4:
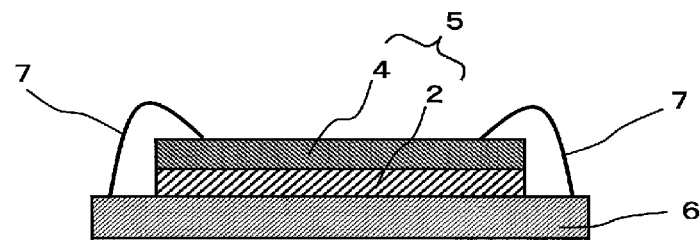
FIG. 4 is a schematic longitudinal cross-sectional view illustrating a preferred embodiment of a step of connecting a bonding wire of a method of producing a semiconductor package of the present invention.

Next, in the method of producing a semiconductor package of the present invention, it is preferable that the wiring board 6 and the semiconductor chip 5 with an adhesive layer are connected via a bonding wire 7 as illustrated in FIG. 4. Such a connection method is not particularly limited, and a publicly known method, for example, a wire bonding method, a TAB (Tape Automated Bonding) method, and the like can be appropriately employed.

Figure 5:
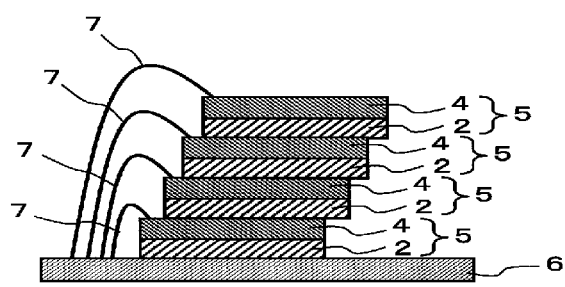
FIG. 5 is a schematic longitudinal cross-sectional view illustrating an example of an embodiment of multistacking of a method of producing a semiconductor package of the present invention.
Figure 6:
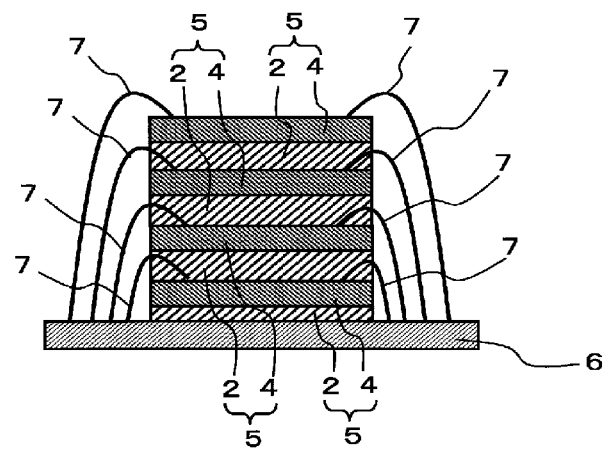
FIG. 6 is a schematic longitudinal cross-sectional view illustrating an example of an embodiment of another multistacking of a method of producing a semiconductor package of the present invention.

Further, a plurality of semiconductor chips 4 can be stacked by thermocompression bonding another semiconductor chip 4 to the surface of the mounted semiconductor chip 4, performing thermal curing, and then connecting the semiconductor chips 4 again to the wiring board 6 by wire bonding. For example, the stacking method include a method of stacking the semiconductor chips in slightly different positions as illustrated in FIG. 5, or a method of stacking the semiconductor chips by increasing the thicknesses of the adhesion layers 2 of the second layer or later and thereby embedding the bonding wire 7 in the adhesive layer 2 as illustrated in FIG. 6, and the like.

Figure 7:
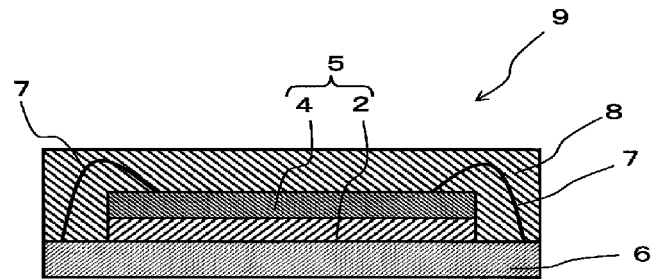
FIG. 7 is a schematic longitudinal cross-sectional view illustrating a preferred embodiment of a semiconductor package produced by a method of producing a semiconductor package of the present invention.

In the method of producing a semiconductor package of the present invention, it is preferable to seal the wiring board 6 and the semiconductor chip 5 with an adhesive layer with a sealing resin 8 as illustrated in FIG. 7. In this way, a semiconductor package 9 can be obtained. The sealing resin 8 is not particularly limited, and a publicly known sealing resin that can be used for the production of the semiconductor package can be appropriately used. In addition, a sealing method with the sealing resin 8 is not particularly limited, and a publicly known method can be appropriately employed.

With the method of producing a semiconductor package of the present invention, generation of voids after a die attach step can be suppressed even in a form of a thin film, and further, an adhesive layer 2 which can exhibit high adhesive force between an adherend can be provided. Further, it becomes possible to efficiency release heat generated on the surface of the semiconductor chip 4 to outside of the semiconductor package 9 by exhibiting excellent thermal conductivity after thermal curing.

EXAMPLES

Hereinafter, the present invention will be described in more detail based on examples and comparative examples, but the present invention is not meant to be limited by the following examples.

In each of Examples and Comparative Examples, measurement of the arithmetic average roughness Ra, the melt viscosity, the thermal conductivity, wafer laminate property evaluation, die attach property evaluation, and adhesive force evaluation were each performed by the methods described below.

Also, the room temperature means 25° C., MEK is methyl ethyl ketone, and PET is polyethylene terephthalate.

<Measurement of Average Particle Diameter (d50) and Ratio of Particle Diameter at 90% Cumulative Distribution Frequency (d90) to Average Particle Diameter (d50)>

A measurement sample was prepared by weighing 0.1 g of each inorganic filler used in each of Examples and Comparative Examples and 9.9 g of MEK respectively, and subjecting a mixture thereof to ultrasonic dispersion treatment for 5 minutes. The average particle diameter (d50) and the particle diameter at 90% cumulative distribution frequency (d90) of this measurement sample were determined from the cumulative curve of the volume fraction of the particle diameter in the particle size distribution measured by the laser diffraction scattering method (model: LMS-2000e, manufactured by Seishin Enterprise Co., Ltd.). The ratio of the particle diameter at 90% cumulative distribution frequency (d90) to the average particle diameter (d50), that is, d90/d50 was calculated from these values.

<Arithmetic Average Roughness Ra>

The arithmetic average roughness Ra of the film-like adhesive was measured by using a surface roughness tester (model: SV3000-CNC, manufactured by Mitutoyo Corporation). The measurement conditions were as follows. In all the film-like adhesives, in the surfaces of the film-like adhesive, a surface on a side which has not been in contact with the release film exhibited larger arithmetic average roughness Ra than that of a surface on a side which has been in contact with the release film. In the table shown below, the arithmetic average roughness Ra of a surface on a side which has not been in contact with the release film will be listed.

Cut-off value: 0.8 mm
Evaluation length: 4 mm
Measurement speed: 0.3 mm/s
Stylus tip radius (R): 2 μm <Measurement of Melt Viscosity>

Squares having a size of 5.0 cm in length×5.0 cm in width were each cut out from the film-like adhesive with a release film obtained in each of Examples and Comparative Examples. The cut samples in a state in which the release film has been peeled off were laminated and bonded on a hot plate at a stage temperature of 70° C. by a hand roller. Thus, a test piece having a thickness of approximately 1.0 mm was obtained. A change in viscosity resistance in a temperature range of 20 to 250° C. at a temperature elevation rate of 5° C./min was measured for this test piece by using a rheometer (RS6000, manufactured by Haake). The melt viscosities at 70° C. and 120° C. (Pa·s) were respectively calculated from the obtained temperature-viscosity resistance curve.

<Thermal Conductivity>

Squares whose one side was 50 mm or more were each cut out from the film-like adhesive with a release film obtained in each of Examples and Comparative Examples. The cut samples in a state in which the release film has been peeled off were stacked such that the thickness of the stacked films was 5 mm or more. This sample was placed on a disk-shaped mold with a diameter of 50 mm and a thickness 5 mm, heated at a temperature of 150° C., a pressure of 2 MPa for 10 minutes by using a compression molding machine, and then taken out. The sample was further heated in a dryer at a temperature of 180° C. for 1 hour to thermally cure the film-like adhesive. Thus, a disk-shaped test piece having a diameter of 50 mm and a thickness of 5 mm was obtained. The thermal conductivity (W/(m·K)) was measured for this test piece by using a thermal conductivity measurement apparatus (trade name: HC-110, manufacture by Eko Instruments Co., Ltd) according to the heat flow meter method (in accordance with JIS-A1412).

<Evaluation of Wafer Laminate>

The film-like adhesive with a release film obtained in each of Examples and Comparative Examples was first bonded to one surface of a dummy silicon wafer (size: 8 inch, thickness: 100 µm) by using a manual laminator (trade name: FM-114, manufactured by Technovision, Inc.) at a temperature of 70° C. and a pressure of 0.3 MPa in a manner that the one surface contacts the film-like adhesive. The presence of voids at the interface between the film-like adhesive and the wafer after bonding was visually observed from the film-like adhesive side. Then, evaluation of the wafer laminate property was performed based on the following criteria. In this test, the evaluation rank "A" is a level practically required.

—Evaluation Criteria—
A: No void is observed.
B: Void is observed.

<Evaluation of Die Attach Property>

The film-like adhesive with a release film obtained in each of Examples and Comparative Examples was first bonded to one surface of a dummy silicon wafer (size: 8 inch, thickness: 100 µm) by using a manual laminator (trade name: FM-114, manufactured by Technovision, Inc.) at a temperature of 70° C. and a pressure of 0.3 MPa. Thereafter, the release film was peeled off from the film-like adhesive. Then, a dicing tape (trade name: K-13, manufactured by Furukawa Electric Co., Ltd.) and a dicing frame (trade name: DTF2-8-1H001, manufactured by DISCO Corporation) were bonded on a surface of the film-like adhesive opposite to the dummy silicon wafer, by using the same manual laminator at room temperature and a pressure of 0.3 MPa. Then, dicing was performed from the dummy silicon wafer side with a dicing size of 10 mm×10 mm by using a dicing apparatus (trade name: DFD-6340, manufactured by DISCO Corporation) equipped with two axes of dicing blades (Z1: NBC-ZH2050 (27HEDD), manufactured by DISCO Corporation/Z2: NBC-ZH127F-SE(BC), manufactured by DISCO Corporation), thus obtaining a dummy chip.

Next, the dummy chip with a film-like adhesive was picked up from the dicing tape by using a die bonder (trade name: DB-800, manufactured by Hitachi High-Tech Corporation). Then, the film-like adhesive side of the dummy chip with a film-like adhesive was thermocompression bonded to the mounting surface side of a lead frame substrate (42Alloy-based, manufactured by Toppan Printing Co., Ltd.) under a condition of a temperature of 120° C., a pressure of 0.1 MPa (load: 400 gf) for 1.0 seconds. Here, the mounting surface of the lead frame substrate is a metal surface having a slight surface roughness.

The presence of voids at the interface between the film-like adhesive and the mounting surface of the lead frame substrate was observed for the dummy chip with a film-like adhesive which has been thermocompression bonded on the substrate, by using an ultrasonic testing apparatus (SAT) (FS300III, manufactured by Hitachi Power Solutions Co., Ltd.). Then, evaluation of the die attach property was performed based on the following criteria. In this test, the evaluation rank "A" is an acceptable level.

—Evaluation Criteria—
A: No void is observed in all the mounted 24 semiconductor chips.
B: Void is observed in at least one of the mounted 24 semiconductor chips.

<Evaluation of Adhesive Force>

The film-like adhesive with a release film obtained in each of Examples and Comparative Examples was first bonded to one surface of a dummy silicon wafer (size: 8 inch, thickness: 350 µm) by using a manual laminator (trade name: FM-114, manufactured by Technovision, Inc.) at a temperature of 70° C. and a pressure of 0.3 MPa. Thereafter, the release film was peeled off from the film-like adhesive. Then, a dicing tape (trade name: K-13, manufactured by Furukawa Electric Co., Ltd.) and a dicing frame (trade name: DTF2-8-1H001, manufactured by DISCO Corporation) were bonded on a surface of the film-like adhesive opposite to the dummy silicon wafer, by using the same manual laminator at room temperature and a pressure of 0.3 MPa. Then, dicing was performed from the dummy silicon wafer side with a dicing size of 2 mm×2 mm by using a dicing apparatus (trade name: DFD-6340, manufactured by DISCO Corporation) equipped with two axes of dicing blades (Z1: NBC-ZH2050 (27HEDD), manufactured by DISCO Corporation/Z2: NBC-ZH127F-SE(BC), manufactured by DISCO Corporation), thus obtaining a dummy chip.

Next, the dummy chip with a film-like adhesive was picked up from the dicing tape by using a die bonder (trade name: DB-800, manufactured by Hitachi High-Tech Corporation). Then, the film-like adhesive side of the dummy chip with a film-like adhesive was thermocompression bonded to the mounting surface side of a lead frame substrate (42Alloy-based, manufactured by Toppan Printing Co., Ltd.) under a condition of a temperature of 120° C., a pressure of 0.1 MPa (load: 400 gf) for 1.0 seconds. This was further heated at 125° C. for 1 hour in a dryer to thermally cure the film-like adhesive.

For the dummy chip with a film-like adhesive, which has been bonded on the substrate, the shear peel force (adhesive force) of the bonded chip against the lead frame substrate was measured by using a multipurpose bondtester (trade name: series 4000PXY, manufactured by Nordson Advanced Technology) and evaluated based on the following criteria. In this test, the evaluation rank "A" is an acceptable level.

—Evaluation Criteria—
- A: Adhesive force is 40 MPa or more.
- B: Adhesive force is 10 MPa or more and less than 40 MPa.
- C: Adhesive force is less than 10 MPa.

[Preparation of Particle Size Distribution of Inorganic Filler]

Preparation of particle size distribution was performed for respective inorganic fillers according to the preparation method A or B, and the prepared inorganic fillers were used in later Examples.

(Inorganic Filler)
- AO-502: trade name, manufactured by Admatechs, alumina filler, thermal conductivity of alumina: 36 W/m·K
- ASFP-20: trade name, manufactured by Denka Company Limited, alumina filler, thermal conductivity of alumina: 36 W/m·K
- DAW-03: trade name, manufactured by Denka Company Limited, alumina filler, thermal conductivity of alumina: 36 W/m·K
- SC0280-SF: trade name, manufactured by Mitsubishi Materials Corporation, silver-coated silicone resin filler, thermal conductivity of silver: 429 W/m·K (Preparation Method)

Preparation method A: the particle size distribution of an inorganic filler was prepared by using a 1.3 μm-mesh filter.

Preparation method B: the particle size distribution of an inorganic filler was prepared by using a capsule filter cartridge (trade name: CCPD-10, model: C1, 10 μm-mesh filter).

The average particle diameter (d50), the particle diameter at 90% cumulative distribution frequency (d90), and the ratio (d90/d50) of the particle diameter at 90% cumulative distribution frequency (d90) to the average particle diameter (d50) before and after preparation of particle size distribution are summarized and shown in the following table.

TABLE 1

| No. | Inorganic filler | Preparation of particle size distribution | Average particle diameter (d50) [μm] | Particle diameter at 90% cumulative distribution frequency (d90) [μm] | d90/d50 |
|---|---|---|---|---|---|
| 1A | AO502 | Before | 0.6 | 3.4 | 5.7 |
| 1B | | After (preparation method A) | 0.5 | 1.8 | 3.6 |
| 2A | ASFP-20 | Before | 0.3 | 1.6 | 5.3 |
| 2B | | After (preparation method A) | 0.3 | 1.2 | 4.0 |
| 3A | DAW-03 | Before | 3.1 | 18.2 | 5.9 |
| 3B | | After (preparation method B) | 3.2 | 8.0 | 2.5 |
| 4A | SC0280-SF | Before | 2.5 | 13.0 | 5.2 |
| 4B | | After (preparation method B) | 2.6 | 4.4 | 1.7 |

[Preparation of Adhesive Composition and Film-Like Adhesive]

Example 1

In a 1,000 ml separable flask, 56 parts by mass of triphenylmethane type epoxy resin (trade name: EPPN-501H, mass average molecular weight: 1,000, softening point: 55° C., semi-solid, epoxy equivalent: 167 g/eq, manufactured by Nippon Kayaku Co., Ltd.), 49 parts by mass of bisphenol A type epoxy resin (trade name: YD-128, mass average molecular weight: 400, softening point: 25° C. or less, liquid, epoxy equivalent: 190 g/eq, manufactured by NSCC Epoxy Manufacturing Co., Ltd.), 30 parts by mass of bisphenol A type phenoxy resin (trade name: YP-50, mass average molecular weight: 70,000, Tg: 84° C., manufactured by NSCC Epoxy Manufacturing Co., Ltd.), and 67 parts by mass of MEK were heated with stirring at 110° C. for 2 hours, thus obtaining a resin varnish.

Subsequently, this resin varnish was transferred to an 800 ml planetary mixer, and 205 parts by mass of an inorganic filler of No. 1B whose particle size distribution has been prepared was introduced to the mixer. Further, 8.5 parts by mass of imidazole type curing agent (trade name: 2PHZ-PW, manufactured by Shikoku Chemicals Corporation) and 3.0 parts by mass of silane coupling agent (trade name: Sila-Ace S-510, manufactured by JNC Corporation) were introduced to the mixer, and the contents were then mixed with stirring for 1 hour at room temperature. Then defoaming was performed under vacuum, thus obtaining a mixed varnish.

Thereafter, the obtained mixed varnish was applied onto a release-treated PET film (release film) having a thickness of 38 μm and then dried by heating at 130° C. for 10 minutes to obtain a film-like adhesive with a release film, having a length of 300 mm, a width of 200 mm, and a thickness of 8 μm.

Example 2

The adhesive composition and film-like adhesive with a release film of Example 2 were obtained in the same manner as in Example 1 except for using 313 parts by mass of inorganic filler of No. 1B whose particle size distribution has been prepared and 103 parts by mass of MEK in Example 1.

Example 3

The adhesive composition and film-like adhesive with a release film of Example 3 were obtained in the same manner as in Example 1 except for using 475 parts by mass of inorganic filler of No. 1B whose particle size distribution has been prepared and 158 parts by mass of MEK in Example 1.

Example 4

The adhesive composition and film-like adhesive with a release film of Example 4 were obtained in the same manner as in Example 1 except for using 205 parts by mass of inorganic filler of No. 2B whose particle size distribution has been prepared in Example 1.

Example 5

The adhesive composition and film-like adhesive with a release film of Example 5 were obtained in the same manner as in Example 1 except for using 313 parts by mass of inorganic filler of No. 2B whose particle size distribution has been prepared and 103 parts by mass of MEK in Example 1.

Example 6

The adhesive composition and film-like adhesive with a release film of Example 6 were obtained in the same manner as in Example 1 except for using 475 parts by mass of inorganic filler of No. 2B whose particle size distribution has been prepared and 158 parts by mass of MEK in Example 1.

Example 7

The adhesive composition and film-like adhesive with a release film of Example 7 were obtained in the same manner as in Example 1 except for using 205 parts by mass of inorganic filler of No. 3B whose particle size distribution has been prepared, and using a capsule filter cartridge (trade name: CCPD-10, model: C1, 10 μm-mesh filter) in Example 1.

Example 8

The adhesive composition and film-like adhesive with a release film of Example 8 were obtained in the same manner as in Example 1 except for using 313 parts by mass of inorganic filler of No. 3B whose particle size distribution has been prepared and 103 parts by mass of MEK in Example 1.

Example 9

The adhesive composition and film-like adhesive with a release film of Example 9 were obtained in the same manner as in Example 1 except for using 475 parts by mass of inorganic filler of No. 3B whose particle size distribution has been prepared and 158 parts by mass of MEK in Example 1.

Example 10

The adhesive composition and film-like adhesive with a release film of Example 10 were obtained in the same manner as in Example 1 except for using 350 parts by mass of inorganic filler of No. 4B whose particle size distribution has been prepared and 88 parts by mass of MEK in Example 1.

Example 11

The adhesive composition and film-like adhesive with a release film of Example 11 were obtained in the same manner as in Example 1 except for using 220 parts by mass of inorganic filler of No. 4B whose particle size distribution has been prepared and 88 parts by mass of MEK in Example 1.

Example 12

The adhesive composition and film-like adhesive with a release film of Example 12 were obtained in the same manner as in Example 1 except for using 170 parts by mass of inorganic filler of No. 4B whose particle size distribution has been prepared and 88 parts by mass of MEK in Example 1.

Example 13

The adhesive composition and film-like adhesive with a release film of Example 13 were obtained in the same manner as in Example 1 except for using 127 parts by mass of inorganic filler of No. 4B whose particle size distribution has been prepared and 88 parts by mass of MEK in Example 1.

Comparative Example 1

The adhesive composition and film-like adhesive with a release film of Comparative Example 1 were obtained in the same manner as in Example 1 except for using 313 parts by mass of inorganic filler of No. 1A whose particle size distribution has not been prepared and 103 parts by mass of MEK in Example 1.

Comparative Example 2

The adhesive composition and film-like adhesive with a release film of Comparative Example 2 were obtained in the same manner as in Comparative Example 1 except for using 313 parts by mass of inorganic filler of No. 2A whose particle size distribution has not been prepared in Comparative Example 1.

Comparative Example 3

The adhesive composition and film-like adhesive with a release film of Comparative Example 3 were obtained in the same manner as in Comparative Example 1 except for using 313 parts by mass of inorganic filler of No. 3A whose particle size distribution has not been prepared in Comparative Example 1.

Comparative Example 4

The adhesive composition and film-like adhesive with a release film of Comparative Example 4 were obtained in the same manner as in Comparative Example 1 except for using 350 parts by mass of inorganic filler of No. 4A whose particle size distribution has not been prepared in Comparative Example 1.

Comparative Example 5

The film-like adhesive composition and film-like adhesive with a release film of Comparative Example 5 are the same as the film-like adhesive composition and film-like adhesive with a release film of Comparative Example 1.

In the wafer laminate evaluation, die attach property evaluation, and adhesive force evaluation, each evaluation was performed by changing the bonding temperature to the wafer from 70° C. to 100° C., and thermocompression bonding temperature to the lead frame substrate from 120° C. to 150° C.

Measurement of the surface roughness, the melt viscosity, the thermal conductivity, wafer laminate evaluation, die attach property evaluation, and adhesive force evaluation were performed for each of the obtained film-like adhesives with a release film, as described above.

The obtained results are summarized and shown in Table 2 together with the compositions of the adhesive composition and the film-like adhesive.

TABLE 2

| | | | Ex. 1 | Ex. 2 | Ex. 3 | Ex. 4 | Ex. 5 |
|---|---|---|---|---|---|---|---|
| Material [parts by mass] | Epoxy resin (A) | EPPN-501H (Triphenylmethane type epoxy resin) | 56 | 56 | 56 | 56 | 56 |
| | | YD-128 (Liquid Bis-A type epoxy resin) | 49 | 49 | 49 | 49 | 49 |
| | Polymer component (C) | YP-50 (Bis-A type phenoxy resin) | 30 | 30 | 30 | 30 | 30 |

TABLE 2-continued

|  |  |  |  |  |  |  |  |
|---|---|---|---|---|---|---|---|
| | Inorganic filler (D) | No. 1B (Particle size distribution has been prepared, AO502) | 205 | 313 | 475 | — | — |
| | | No. 2B (Particle size distribution has been prepared, ASFP-20) | — | — | — | 205 | 313 |
| | | No. 3B (Particle size distribution has been prepared, DAW-03) | — | — | — | — | — |
| | | No. 4B (Particle size distribution has been prepared, SC0280-SF) | — | — | — | — | — |
| | Surface treatment agent | S-510 (Epoxysilane type silane coupling agent) | 3.0 | 3.0 | 3.0 | 3.0 | 3.0 |
| | Epoxy resin curing agent (B) | 2PHZ-PW (Imidazole-based curing agent) | 8.5 | 8.5 | 8.5 | 8.5 | 8.5 |
| | The blended amount in terms of total solid content [parts by mass] | | 351 | 459 | 621 | 351 | 459 |
| | Inorganic filler amount [vol %] | | 30 | 40 | 50 | 30 | 40 |
| Characteristics/ evaluation | Arithmetic average roughness Ra [μm] | | 0.5 | 0.5 | 0.5 | 0.3 | 0.3 |
| | Melt viscosity at 70° C. [Pa·s] | | 7150 | 13500 | 40000 | 8540 | 18000 |
| | Melt viscosity at 120° C. [Pa·s] | | 6900 | 8600 | 9000 | 7100 | 8500 |
| | Thermal conductivity [W/m·K] | | 1.0 | 1.5 | 1.8 | 1.0 | 1.4 |
| | Wafer laminate evaluation | | A | A | A | A | A |
| | Die attach evaluation | | A | A | A | A | A |
| | Adhesive force evaluation | | A | A | A | A | A |

| | | | Ex. 6 | Ex. 7 | Ex. 8 | Ex. 9 | Ex. 10 |
|---|---|---|---|---|---|---|---|
| Material [parts by mass] | Epoxy resin (A) | EPPN-501H (Triphenylmethane type epoxy resin) | 56 | 56 | 56 | 56 | 56 |
| | | YD-128 (Liquid Bis-A type epoxy resin) | 49 | 49 | 49 | 49 | 49 |
| | Polymer component (C) | YP-50 (Bis-A type phenoxy resin) | 30 | 30 | 30 | 30 | 30 |
| | Inorganic filler (D) | No. 1B (Particle size distribution has been prepared, AO502) | — | — | — | — | — |
| | | No. 2B (Particle size distribution has been prepared, ASFP-20) | 475 | — | — | — | — |
| | | No. 3B (Particle size distribution has been prepared, DAW-03) | — | 205 | 313 | 475 | — |
| | | No. 4B (Particle size distribution has been prepared, SC0280-SF) | — | — | — | — | 350 |
| | Surface treatment agent | S-510 (Epoxysilane type silane coupling agent) | 3.0 | 3.0 | 3.0 | 3.0 | 3.0 |
| | Epoxy resin curing agent (B) | 2PHZ-PW (Imidazole-based curing agent) | 8.5 | 8.5 | 8.5 | 8.5 | 8.5 |
| | The blended amount in terms of total solid content [parts by mass] | | 621 | 351 | 459 | 621 | 496 |
| | Inorganic filler amount [vol %] | | 50 | 30 | 40 | 50 | 40 |
| Characteristics/ evaluation | Arithmetic average roughness Ra [μm] | | 0.3 | 1.5 | 1.5 | 1.5 | 1.3 |
| | Melt viscosity at 70° C. [Pa·s] | | 38000 | 6320 | 21000 | 33000 | 18000 |
| | Melt viscosity at 120° C. [Pa·s] | | 9750 | 900 | 1580 | 2500 | 3000 |
| | Thermal conductivity [W/m·K] | | 1.7 | 1.5 | 2.0 | 2.5 | 6.2 |
| | Wafer laminate evaluation | | A | A | A | A | A |
| | Die attach evaluation | | A | A | A | A | A |
| | Adhesive force evaluation | | A | A | A | A | A |

| | | | Ex. 11 | Ex. 12 | Ex. 13 |
|---|---|---|---|---|---|
| Material [parts by mass] | Epoxy resin (A) | EPPN-501H (Triphenylmethane type epoxy resin) | 56 | 56 | 56 |
| | | YD-128 (Liquid Bis-A type epoxy resin) | 49 | 49 | 49 |
| | Polymer component (C) | YP-50 (Bis-A type phenoxy resin) | 30 | 30 | 30 |
| | Inorganic filler (D) | No. 1B (Particle size distribution has been prepared, AO502) | — | — | — |
| | | No. 2B (Particle size distribution has been prepared, ASFP-20) | — | — | — |
| | | No. 3B (Particle size distribution has been prepared, DAW-03) | — | — | — |
| | | No. 4B (Particle size distribution has been prepared, SC0280-SF) | 220 | 170 | 127 |
| | Surface treatment agent | S-510 (Epoxysilane type silane coupling agent) | 3.0 | 3.0 | 3.0 |
| | Epoxy resin curing agent (B) | 2PHZ-PW (Imidazole-based curing agent) | 8.5 | 8.5 | 8.5 |
| | The blended amount in terms of total solid content [parts by mass] | | 366 | 316 | 273 |
| | Inorganic filler amount [vol %] | | 30 | 25 | 20 |
| Characteristics/ evaluation | Arithmetic average roughness Ra [μm] | | 1.3 | 1.3 | 1.3 |
| | Melt viscosity at 70° C. [Pa·s] | | 15000 | 9000 | 7800 |
| | Melt viscosity at 120° C. [Pa·s] | | 1450 | 700 | 350 |
| | Thermal conductivity [W/m·K] | | 3.5 | 2.5 | 1.8 |
| | Wafer laminate evaluation | | A | A | A |
| | Die attach evaluation | | A | A | A |
| | Adhesive force evaluation | | A | A | A |

TABLE 2-continued

| | | | CEx. 1 | CEx. 2 | CEx. 3 | CEx. 4 | CEx. 5 |
|---|---|---|---|---|---|---|---|
| Material [parts by mass] | Epoxy resin (A) | EPPN-501H (Triphenylmethane type epoxy resin) | 56 | 56 | 56 | 56 | 56 |
| | | YD-128 (Liquid Bis-A type epoxy resin) | 49 | 49 | 49 | 49 | 49 |
| | Polymer component (C) | YP-50 (Bis-A type phenoxy resin) | 30 | 30 | 30 | 30 | 30 |
| | Inorganic filler (D) | No. 1A (AO502) | 313 | — | — | — | 313 |
| | | No. 2A (ASFP-20) | — | 313 | — | — | — |
| | | No. 3A (DAW-03) | — | — | 313 | — | — |
| | | No. 4A (SC0280-SF) | — | — | — | 350 | — |
| | Surface treatment agent | S-510 (Epoxysilane type silane coupling agent) | 3 | 3 | 3 | 3 | 3 |
| | Epoxy resin curing agent (B) | 2PHZ-PW (Imidazole-based curing agent) | 8.5 | 8.5 | 8.5 | 8.5 | 8.5 |
| | The blended amount in terms of total solid content [parts by mass] | | 459 | 459 | 459 | 496 | 459 |
| | Inorganic filler amount [vol %] | | 40 | 40 | 40 | 40 | 40 |
| Characteristics/ evaluation | Arithmetic average roughness Ra [μm] | | 4.3 | 3.3 | 5.5 | 4.2 | 4.3 |
| | Melt viscosity at 70° C. [Pa · s] | | 8360 | 32500 | 7000 | 21500 | 8360 |
| | Melt viscosity at 120° C. [Pa · s] | | 1160 | 11000 | 800 | 3100 | 1160 |
| | Thermal conductivity [W/m · K] | | 1.2 | 0.9 | 0.9 | 6.1 | 1.2 |
| | Wafer laminate evaluation | | B | B | B | B | A* |
| | Die attach evaluation | | B | B | B | B | A* |
| | Adhesive force evaluation | | C | C | B | A | C* |

Remarks: 'Ex.' means Example according to this invention.
Remarks: 'Ex.' means Example according to this invention.
Remarks: 'Ex.' means Example according to this invention.
Remarks: 'CEx.' means Comparative Example.

<Notes of Tables>

The symbol "—" in the row of the inorganic filler means not containing the corresponding component.

The symbol "*" in the wafer laminate evaluation, die attach property evaluation, and adhesive force evaluation of Comparative Example 5 means that each evaluation was performed by changing the bonding temperature to the wafer from 70° C. to 100° C., and thermocompression bonding temperature to the lead frame substrate from 120° C. to 150° C.

The "inorganic filler material [vol %]" is the proportion (% by volume) of the inorganic filler (D) in the total content of the epoxy resin (A), the epoxy resin curing agent (B), the polymer component (C), and the inorganic filler (D).

The following is clear from Table 2.

The film-like adhesives of Examples 1 to 13 are obtained from the adhesive composition of the present invention containing the epoxy resin (A), the epoxy resin curing agent (B), the polymer component (C), and the inorganic filler (D), in which the proportion of the inorganic filler (D) in the total content of these components (A) to (D) is 30 to 70% by volume, the average particle diameter (d50) of the inorganic filler (D) is 0.1 to 3.5 μm, and the ratio of the particle diameter at 90% cumulative distribution frequency (d90) to the average particle diameter (d50) is 5.0 or less. For the film-like adhesives of these Examples 1 to 13 which have thermal conductivity and are a thin film having a thickness of 8 μm, generation of voids was not observed in all the semiconductor chips observed in the die attach property evaluation, and high adhesive force and excellent adhesiveness were exhibited.

In contrast, the film-like adhesives of Comparative Examples 1 to 4 are not the film-like adhesive obtained from the adhesive composition defined in the present invention, because although the average particle diameter (d50) is in a range of 0.1 to 3.5 μm, the ratio of the particle diameter at 90% cumulative distribution frequency (d90) to the average particle diameter (d50) is more than 5.0. In Comparative Example 1, generation of voids was observed in four semiconductor chips in the die attach property evaluation. In Comparative Example 2, generation of voids was observed in eight semiconductor chips in the die attach property evaluation. Moreover, in Comparative Examples 1 and 2, adhesive force was less than 10 MPa, which was low and adhesiveness was poor. In Comparative Example 3, generation of voids was observed in ten semiconductor chips in the die attach property evaluation, and adhesive force was less than 40 MPa, which was low and adhesiveness was poor. In Comparative Example 4, generation of voids was observed in three semiconductor chips in the die attach property evaluation. Thus, Comparative Example 4 was inferior in suppressing generation of voids.

Meanwhile, Comparative Example 5 is an example in which the same film-like adhesive as Comparative Example 1 was used, the bonding temperature to the wafer was changed from 70° C. to 100° C., and the thermocompression bonding temperature to the lead frame substrate was changed from 120° C. to 150° C. In this Comparative Example 5, generation of voids was not observed at all in the die attach property evaluation because the bonding temperature to the wafer and the thermocompression bonding temperature to the lead frame substrate were adjusted. However, in Comparative Example 5, adhesive force was less than 10 MPa, which was low and adhesiveness was poor. That is, it was found that, in a form of a thin film adhesive having a thickness of less than 10 μm, presence of generation of voids is not necessarily correlated with adhesive force, and suppression of generation of voids and excellent adhesiveness can be both achieved by using the film-like adhesive obtained from the adhesive composition of the present invention.

Having described our invention as related to the present embodiments, it is our intention that the invention not be limited by any of the details of the description, unless otherwise specified, but rather be construed broadly within its spirit and scope as set out in the accompanying claims.

REFERENCE SIGNS LIST

1 Semiconductor wafer
2 Film-like adhesive layer
3 Dicing tape

4 Semiconductor chip
5 Semiconductor chip with a film-like adhesive
6 Wiring board
7 Bonding wire
8 Sealing resin
9 Semiconductor package

The invention claimed is:

1. An adhesive composition, comprising:
an epoxy resin (A);
an epoxy resin curing agent (B);
a polymer component (C); and
an inorganic filler (D),
wherein the inorganic filler (D) satisfies the condition (1) of (an average particle diameter (d50) is 0.1 to 3.5 µm) and condition (2) of (a ratio of a particle diameter at 90% cumulative distribution frequency (d90) to the average particle diameter (d50) is 5.0 or less), and
wherein a proportion of the inorganic filler (D) in a total content of the epoxy resin (A), the epoxy resin curing agent (B), the polymer component (C) and the inorganic filler (D) is 20 to 70% by volume.

2. The adhesive composition according to claim 1,
wherein when a film-like adhesive obtained from the adhesive composition is heated at a temperature elevation rate of 5° C./min from 25° C., a melt viscosity at 70° C. reaches a range of 6,000 to 50,000 Pa·s, and a melt viscosity at 120° C. reaches a range of 500 to 10,000 Pa·s, and
wherein a cured product having a thermal conductivity of 1.0 W/m·K or more is obtained after thermal curing of the film-like adhesive.

3. The adhesive composition according to claim 1, wherein the polymer component (C) comprises a phenoxy resin.

4. The adhesive composition according to claim 1,
wherein the inorganic filler (D) is a particle made of a thermally conductive material or a particle whose surface is coated with the thermally conductive material, and
wherein a thermal conductivity of the thermally conductive material is 12 W/m·K or more.

5. A film-like adhesive, which is obtained from the adhesive composition according to claim 1,
wherein an arithmetic average roughness Ra of a surface of the film-like adhesive is 3.0 µm or less, and
wherein a thickness of the film-like adhesive is in a range of 1 µm or more and less than 10 µm.

6. A method of producing a film-like adhesive, comprising manufacturing by applying the adhesive composition according to claim 1 on a substrate film subjected to release treatment and drying the adhesive composition.

7. A method of producing a semiconductor package, comprising:
a first step of providing an adhesive layer by thermocompression bonding the film-like adhesive according to claim 5 to a back surface of a semiconductor wafer in which at least one semiconductor circuit is formed on a surface, and providing a dicing tape via the adhesive layer;
a second step of dicing the semiconductor wafer and the adhesive layer simultaneously to obtain a semiconductor chip with an adhesive layer, the semiconductor chip with an adhesive layer including the semiconductor wafer and the adhesive layer on the dicing tape;
a third step of removing the dicing tape from the adhesive layer and thermocompression bonding the semiconductor chip with an adhesive layer and a wiring board via the adhesive layer; and
a fourth step of thermally curing the adhesive layer.

* * * * *